United States Patent
Kraus et al.

(10) Patent No.: US 10,774,443 B2
(45) Date of Patent: Sep. 15, 2020

(54) REACTOR FOR DEPOSITING POLYCRYSTALLINE SILICON

(71) Applicant: Wacker Chemie AG, Munich (DE)

(72) Inventors: Heinz Kraus, Zeilarn (DE); Christian Kutza, Ampfing (DE)

(73) Assignee: WACKER CHEMIE AG, Munich (DE)

( * ) Notice: Subject to any disclaimer, the term of this patent is extended or adjusted under 35 U.S.C. 154(b) by 131 days.

(21) Appl. No.: 15/768,348

(22) PCT Filed: Oct. 11, 2016

(86) PCT No.: PCT/EP2016/074317
§ 371 (c)(1),
(2) Date: Apr. 13, 2018

(87) PCT Pub. No.: WO2017/064048
PCT Pub. Date: Apr. 20, 2017

(65) Prior Publication Data
US 2018/0298521 A1   Oct. 18, 2018

(30) Foreign Application Priority Data

Oct. 14, 2015   (DE) .................. 10 2015 219 925

(51) Int. Cl.
*C23C 16/00* (2006.01)
*C30B 29/06* (2006.01)
*C01B 33/035* (2006.01)

(52) U.S. Cl.
CPC ............ *C30B 29/06* (2013.01); *C01B 33/035* (2013.01)

(58) Field of Classification Search
CPC .................................................... C01B 33/035
See application file for complete search history.

(56) References Cited

U.S. PATENT DOCUMENTS

| | | | |
|---|---|---|---|
| 6,258,900 B1 | 7/2001 | Glover | |
| 2007/0207068 A1* | 9/2007 | Lange | B01J 8/003 422/139 |
| 2009/0136408 A1* | 5/2009 | Endoh | C01B 33/035 423/349 |
| 2009/0180944 A1 | 7/2009 | Hesse et al. | |
| 2011/0290184 A1* | 12/2011 | Yu | C01B 33/035 118/723 R |
| 2012/0058040 A1 | 3/2012 | Haeckl et al. | |
| 2013/0302528 A1 | 11/2013 | Kurosawa et al. | |

(Continued)

FOREIGN PATENT DOCUMENTS

| CN | 1982213 A | 6/2007 |
|---|---|---|
| CN | 103896270 A | 7/2014 |

(Continued)

OTHER PUBLICATIONS

English translation JP 63-007369, JP 63-007369, Jan. 1988 (Year: 1988).*

*Primary Examiner* — Keath T Chen
(74) *Attorney, Agent, or Firm* — Brooks Kushman P.C.

(57) ABSTRACT

The yield and quality of polysilicon rods produced in the Siemens process are increased by preventing pieces of silicon too large to be removed by flushing with gas from entering reaction gas inlets and offgas outlets by means of protective elements installed in the inlets and/or outlets.

15 Claims, 8 Drawing Sheets

(56) References Cited

U.S. PATENT DOCUMENTS

| | | |
|---|---|---|
| 2015/0107771 A1* | 4/2015 | Kobayashi ........ H01J 37/32834 156/345.29 |
| 2016/0045886 A1 | 2/2016 | Kraus et al. |
| 2016/0067663 A1 | 3/2016 | Popp et al. |
| 2017/0349443 A1 | 12/2017 | Weiss et al. |

FOREIGN PATENT DOCUMENTS

| | | | |
|---|---|---|---|
| CN | 203890069 U | 10/2014 | |
| DE | 19847647 A1 | 4/2000 | |
| EP | 2077252 A2 | 7/2009 | |
| JP | 63-007369 * | 1/1988 | .............. G03G 5/08 |
| WO | 2007032518 A1 | 3/2007 | |
| WO | 2010141551 A1 | 12/2010 | |
| WO | 2013010943 A1 | 1/2013 | |
| WO | 2014146877 A1 | 9/2014 | |
| WO | 2014166711 A1 | 10/2014 | |
| WO | 2016110402 A1 | 7/2016 | |
| WO | 19154502 A1 | 8/2019 | |

* cited by examiner

REACTOR FOR DEPOSITING POLYCRYSTALLINE SILICON

CROSS REFERENCE TO RELATED APPLICATIONS

This application is the U.S. National Phase of PCT Appln. No. PCT/EP2016/074317 filed Oct. 11, 2016, which claims priority to German Application No. 10 2015 219 925.8 filed Oct. 14, 2015, the disclosures of which are incorporated in their entirety by reference herein.

BACKGROUND OF THE INVENTION

1. Field of the Invention

The invention relates to a reactor for deposition of polycrystalline silicon.

2. Description of the Related Art

High-purity polycrystalline silicon (polysilicon) serves as starting material for the production of monocrystalline silicon for semiconductors according to the Czochralski (CZ) or zone melting (FZ) processes and for the production of mono- or multicrystalline silicon according to various pulling and casting processes for production of solar cells for the photovoltaics sector.

Polysilicon is typically produced by the Siemens process. This comprises introducing a reaction gas comprising one or more silicon-containing components and optionally hydrogen into a reactor comprising support bodies heated by direct passage of current to deposit solid silicon on the support bodies. Silicon-containing components employed are preferably silane ($SiH_4$), monochlorosilane ($SiH_3Cl$), dichlorosilane ($SiH_2Cl_2$), trichlorosilane ($SiHCl_3$), tetrachlorosilane ($SiCl_4$) or mixtures of the recited substances.

The Siemens process is typically performed in a deposition reactor (also known as a "Siemens reactor"). In the most commonly used embodiment the reactor comprises a metallic base plate and a coolable bell jar placed on the base plate to form a reaction space inside the bell jar. The base plate is provided with one or more gas inlet openings and one or more offgas openings for the outgoing reaction gases and also with holders by means of which the support bodies in the reaction space are held and supplied with electrical current.

Each support body usually consists of two thin filament rods and a bridge which generally connects adjacent rods at their free ends. The filament rods are most commonly manufactured from mono- or polycrystalline silicon, metals/alloys or carbon being employed less commonly. The filament rods are push-fitted into electrodes located on the reactor floor which provide the connection to the current supply. High-purity polysilicon is deposited on the heated filament rods and the horizontal bridge to increase the diameter thereof over time. The process is terminated once the desired diameter has been achieved.

Deposition reactors in which the reaction gas is introduced via nozzles in the lower part, the so-called base plate, are employed as standard for producing polysilicon. However, introduction of the reaction gas in the upper part of the reactor via nozzles is likewise possible.

Likewise, offgas formed is often discharged via one or more openings in the reactor floor but also via the reactor hood.

Since a uniform distribution of the feed gas is important for uniform deposition on the rods the gas is typically supplied via a plurality of nozzles. Such a distribution of the feed gas may be realized either by means of a multiplicity of individual feed gas conduits each having a direct connection to the individual feed gas nozzles or via a gas distributor, for example an annular or other type of gas distributor in proximity to the reactor, usually below the reactor base plate, having a plurality of connections for the individual feed gas nozzles.

During the deposition process, cracks may form in the growing silicon rods. Consequently, silicon shards of various sizes can fall into the feed gas openings and offgas openings and block the gas conduits/gas distributors. In the worst case all rods may collapse causing very large silicon pieces to fall into the inlet and outlet openings.

In the case of the feed gas such a blockage results in a nonuniform distribution/incorrect metering of the feed gas and in the case of the offgas blockage can result in an undesired pressure increase in the reactor. For these reasons the silicon pieces must be removed no later than before the following batch. Silicon pieces can usually only be removed at relatively great effort (for example manually or with a gripping device, vacuum cleaner). This procedure is inconvenient and protracted (i.e. longer set up times) and does not always succeed since very large pieces are sometimes too bulky for the gripping device and cannot be vacuumed with the vacuum cleaner.

WO 2014/166711 A1 discloses a gas distributor and an offgas collector which are composed of two or more sections and are gastightly joined to one another by detachable means (for example a flange). This allows removal of the Si pieces that have fallen in through the simplified removal and cleaning of the gas distributor/offgas collector.

Despite the possible simplified cleaning of the gas distributor/of the offgas collector since perhaps only the contaminated part of the modularly constructed protective element must require deinstallation and cleaning, the deinstallation, cleaning and reinstallation procedures are associated with significant time expenditure. The required search for shards and shard removal result in poor yield because of failure to achieve the target diameter and because of increased batch changeover time.

Since the trend is for larger deposition plants with high-yield processes which require larger feed amounts and thus feed gas nozzles of larger diameter, this problem is exacerbated. On account of the large nozzle diameters silicon shards can yet more easily enter into the feed gas system through the nozzles and partially block the system. The partially blocked feed gas system results in the various nozzles receiving a nonuniform feed supply.

The offgas openings in the base plate are generally larger than the diameter of the feed gas nozzles. Furthermore, the base plates generally have a plurality of offgas openings which are generally arranged symmetrically in the base plate. Due to the size of the offgas openings both Si shards and chunks, formed due to fallen-over batches during the deposition, during cooling of the rods after the end of the deposition process, or during deinstallation of the rods out of the reactor ("harvesting"), can get into the offgas system and partially block one or more offgas conduits. These Si pieces may have a length of 0-300 mm and a cross section of 0 up to the cross section of the offgas opening.

Blockages or partial blockages in feed gas conduits and offgas conduits can result in nonuniform flow in the reactor and thus in nonuniform diameter growth of the individual polysilicon rods, and nonuniformly severe popcorn growth, in a worst case, causing outage of the plant during the deposition process. When a plurality of offgas openings are present and when one or more offgas openings are partially blocked the gas flow in the reactor becomes asymmetric.

Shards or Si chunks in the feed gas conduit influence the fluid dynamics in the reactor on account of nonuniform distribution of the feed gas to the individual nozzles and thus result in an asymmetric flow profile in the deposition reactor. Si chunks in the offgas openings or offgas conduits likewise result in an asymmetric flow profile in the deposition reactor.

An asymmetric reactor flow lowers process stability through batch failure during the deposition process (rod pairs falling over). Fallen-over rod pairs must be downgraded to low-grade product due to contaminants or laboriously cleaned. Rod pieces having excessively deep popcorn growth must be downgraded to a low-grade product since the popcorn fraction is a quality criterion and constituent of the product specification. The thickest rod diameter determines the switchoff diameter of the batch. Thinner rods within a batch thus reduce plant yield and increase production costs.

CN 100425532 C describes a feed gas pipe which projects into the reactor. The feed gas pipe has a plurality of lateral openings at different heights to supply the silicon rods with feed. Since there is no vertical opening present, shards cannot get into the feed gas system. However, such a configuration is disadvantageous since a vertical gas flow cannot be established in the production of polysilicon. Another disadvantage is the length of the feed gas pipe which is subjected to thermal and chemical stress of sufficient severity to result in corrosion of the feed gas pipe and consequently in contamination of the polysilicon produced.

CN 203890069 U describes an apparatus for settling dust out of the offgas. It consists of two parts made of graphite push-fitted into one another and lies on the base plate over the offgas opening and projects into the reactor space. The outer part has a circumferentially arranged multiplicity of openings through which the dust-containing offgas flows. The dust sediments between the outer part and the inner part.

CN 103896270 A describes a tube-shaped component, closed at its upper end, made of graphite with lateral bores located upstream of a tube bundle heat exchanger in the offgas system of a deposition plant for deposition of polycrystalline silicon. The component is intended to uniformize the downstream tube flow and keep abrasive particles (amorphous silicon) away from the heat exchanger, thus avoiding corrosion of the heat exchanger in the form of abrasion.

The latter two publications have the problem that the graphite parts are not able to mechanically withstand larger falling Si pieces. The components are destroyed and Si pieces get into the offgas conduit.

The object to be achieved by the invention arose from the problems described.

SUMMARY OF THE INVENTION

The invention is directed to a reactor for deposition of polycrystalline silicon which is delimited laterally and upwardly by a reactor wall and downwardly by a base plate, comprising a plurality of filament rods heatable by direct passage of current and attached to the base plate, a feed gas system passing through one or more openings in the base plate for introducing a silicon-containing reaction mixture into the reactor and an offgas system passing through one or more openings in the base plate for discharging offgas from the reactor, characterized in that the feed gas system and/or the offgas system comprise at least one protective element made of metal, of ceramic or of CFC which comprises openings or mesh apertures, wherein the openings and the mesh apertures of the protective element are configured such that only silicon pieces which may be removed from the feed gas or offgas system by flushing can enter the feed gas or offgas system below the protective element.

DETAILED DESCRIPTION OF THE PREFERRED EMBODIMENTS

Figure 1:
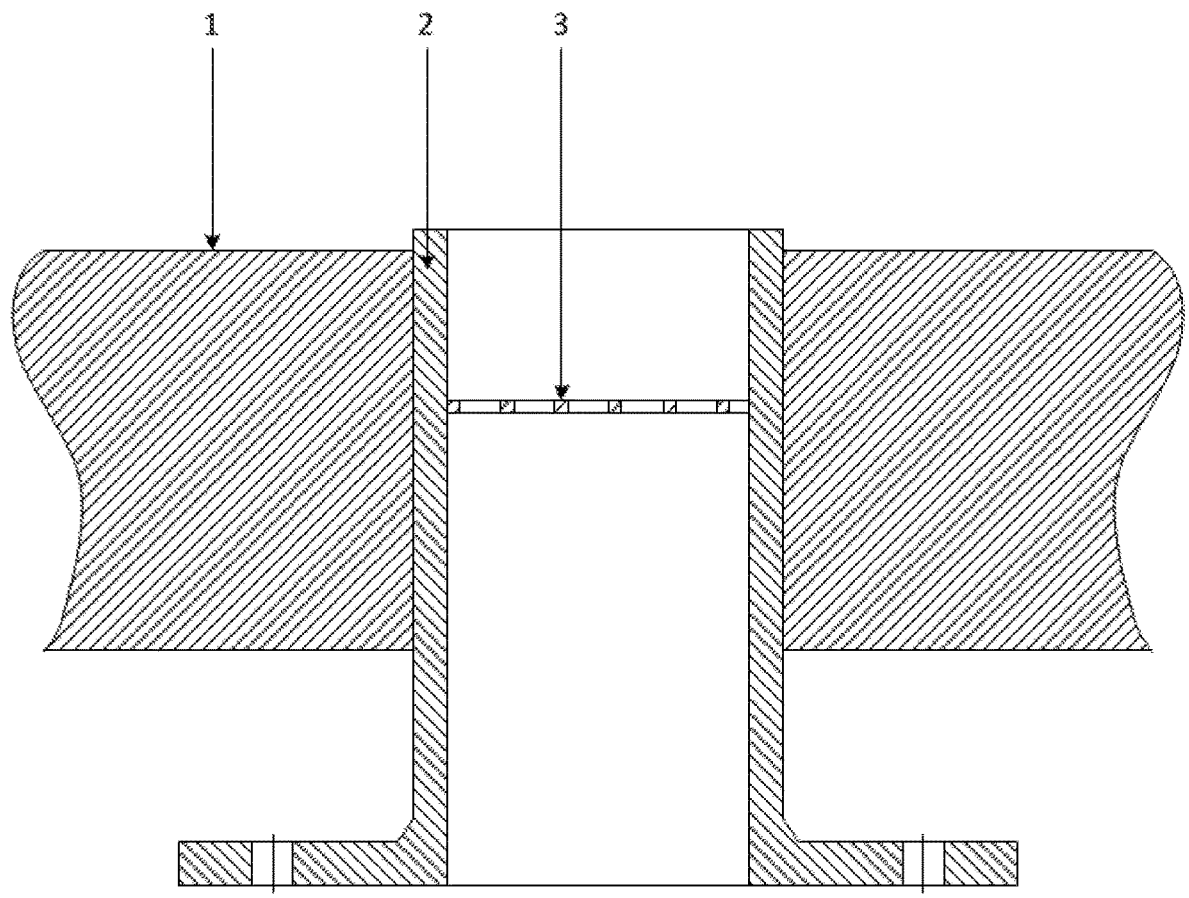
FIG. 1 shows a schematic representation of a grid in the feed gas conduit.

The term "feed gas system" is to be understood as meaning one or more nozzles and one or more feed gas conduits each connected to a nozzle or a gas distributor connected to the nozzles. Thus, feed gas conduits and nozzles may each be directly connected to one another. However, it is also possible to provide below the base plate a gas distributor having a plurality of connections for the individual feed gas nozzles. Nozzles and feed gas conduits pass through openings in the base plate and are secured on the base plate. However, other configurations are also conceivable, for example a combination of a gas distributor and individual feed gas conduits connected to nozzles.

The term "offgas system" is to be understood as meaning one or more openings in the base plate and the offgas conduits connected to these openings.

In one embodiment, the offgas system comprises an offgas collector which is communicatively connected to one or more offgas openings in the base plate. If the base plate has three offgas openings the offgas collector may likewise have three gas inlet openings each communicatively connected with one of the offgas openings in the reactor. However, other configurations are also conceivable, for example a combination of offgas collectors and individual offgas conduits.

In the feed gas system, the protective element may thus be installed in the nozzle or into the feed gas conduit. Each individual nozzle or each individual feed gas conduit is to be fitted with a protective element.

In one embodiment of the invention the protective element is a grid installed in the cross section of a feed gas conduit or nozzle. The grid may be at a distance of 0-500 mm from the end of the feed gas conduit. The end of the feed gas conduit is defined as the top edge of the nozzle. The grid may accordingly be secured or screw-fitted in the feed gas conduit or to the top side of, the bottom side of, or in, the nozzle.

The grid may have a flat surface or a curved shape.

The grid may be made of a woven mesh or may comprise a base body with holes. The shape of the holes may be round, square or any other desired shape. A round or a square shape is preferred.

The base body of the grid may be implemented in different geometries. Possible geometries are: disc, spherical or oval, conical or two- or three-dimensionally curved. In a preferred embodiment a flat disc is employed.

Each embodiment of the grid may be secured at different angles to the flow direction in the nozzle. The angle may be 0-80°.

In one embodiment the grid is secured to the underside of the nozzle. The term "underside" is to be understood as meaning the side which is screw-fitted to the feed gas conduit.

Possible means of attaching the grid to the nozzle are: welding, soldering, screw-fitting, push-fitting or clamping.

The grid may likewise already have been machined from solid stock during production of the nozzle.

In a preferred embodiment the securing of the grid to the nozzle is achieved by welding. It is advantageous to fabricate the nozzle and the grid from the same material of construction.

Suitable materials of construction for the grid are all metals (stainless steels, noble metals), ceramics and CFC (carbon-fiber-reinforced carbon) that are resistant to hot HCl and chlorosilane mixtures.

The mesh aperture size (a) of the grid is between 2-15 mm, preferably 3-10 mm and more preferably 3-7 mm. The web width (b) of the grid is between 0.5-5 mm. Preferably 0.5-3 mm, particularly preferably 0.5-2 mm.

The ratio of the sum of all hole areas to the total area of the grid K1 should be between 0.2 and 0.8. The term "total area of the grid" is to be understood as the sum of all hole areas plus the sum of all web areas (cf. FIG. 2 and FIG. 3 with definition of web width). In a preferred embodiment the ratio K1 is 0.3-0.7, and in a particularly preferred embodiment the ratio K1 is 0.4-0.65.

In another embodiment the protective element is an offgas sieve installed in the offgas conduit. The offgas sieve is intended to avoid offgas conduits becoming blocked by Si pieces. The offgas sieve may be placed in the offgas conduit downstream of the base plate or in the offgas openings of the base plate. In the simplest case the offgas sieve is a perforated disc between the flanges in the offgas conduit.

The offgas sieve is preferably in the shape of a basket which is suspended in the offgas opening of the base plate. This has the advantage of easy accessibility and replaceability. To this end it is advantageous when the basket has a widening at its upper end for contacting against the base plate.

In one embodiment an offgas basket projects into the offgas opening and the basket is open in the upward direction toward base plate, closed in the downward direction toward the offgas conduit and provided with holes in its wall.

The offgas basket may be cylindrical or may taper conically in the downward direction. It may also have any other desired shape that fits into the offgas opening. A downwardly conically tapering shape is preferred.

The area of the individual holes of the offgas basket is between 15-225 mm², preferably 15-150 mm², and more preferably 15-100 mm².

The ratio K2 of the sum of all hole areas to the area of the offgas basket projecting into the offgas opening should be between 0.2 and 0.9. The area of the offgas basket projecting into the offgas opening is the sum of all hole areas plus the sum of all non-hole areas. In a preferred embodiment the ratio K2 is 0.3-0.8. In a particularly preferred embodiment the ratio K2 is 0.5-0.8.

Suitable materials of construction for the offgas sieve/the offgas basket include all metals (stainless steels, noble metals), tungsten, ceramics such as $ZrO_2$, yttrium-oxide-stabilized $ZrO_2$, $Si_3N_4$, silicon carbide, and CFC, that are resistant to hot HCl and chlorosilane mixtures.

The use of CFC, $ZrO_2$ and yttrium-stabilized $ZrO_2$ is preferred.

The offgas sieve/offgas basket may be made of one part or may be joined together from a plurality of individual parts, for example by welding, push-fitting, screw-fitting, clamping or fixing with the pins.

The offgas sieve/offgas basket is preferably monolithic.

In one embodiment of the invention the above-described embodiments of protective elements in the feed gas system and the above-described embodiments of protective elements in the offgas system are combined with one another.

It is accordingly most preferable when both the feed gas system and the offgas system have such protective elements.

In one embodiment every nozzle or alternatively every feed gas conduit connected to a nozzle comprises a grid as described above while simultaneously an offgas basket is suspended in every offgas opening in the base plate.

The invention also relates to a process for producing polycrystalline silicon, comprising introducing a reaction gas containing a silicon-containing component and hydrogen into a reactor according to one or more of the embodiments described above containing a plurality of filament rods which are each supplied with current by means of an electrode and thus heated by direct passage of current to a temperature at which polycrystalline silicon is deposited on the filament rods.

The invention accordingly makes it possible to avoid silicon shards/chunks larger than the openings in the protective elements in the feed gas system and offgas system and to remove silicon shards/chunks smaller than the openings in the protective elements by simple backflushing.

Uniform fluid distributions in the feed gas system and in the reactor are accordingly achievable. A symmetrical reactor flow results in uniform growth of the rod pairs and in a homogenous morphology of the individual rod pairs.

By contrast, asymmetric reactor flow will result in the growth of rods of different thicknesses having different morphologies. The switchoff diameter of a batch is limited by the thickest rod pair. Uniformly thick rod pairs allow higher batch weights to be achieved, thus resulting in higher yield and lower costs.

In the case of excessively poor morphology (excessively porous material having excessively high popcorn fraction) the silicon must partly be downgraded to a low-grade product. This downgrading is dispensed with in the case of uniform morphology since the morphology may then be deliberately adjusted via the deposition process. The term "morphology" is to be understood as meaning the compactness and the surface and bulk constitution with respect to more or less pronounced popcorn.

It is advantageous that setup time is shortened since a search for shards, by endoscopy for example, and a time-consuming removal of the shards during batch changeover is dispensed with.

The features recited in connection with the abovedescribed embodiments of the reactor according to the invention may be applied correspondingly to the process according to the invention. These and other features of the embodiments according to the invention are elucidated in the description of the figures and in the claims. The individual features may be realized either separately or in combination as embodiments of the invention. Said features may further describe advantageous implementations eligible for protection in their own right.

The invention is hereinbelow additionally elucidated with reference to FIGS. 1-8.

LIST OF REFERENCE NUMERALS EMPLOYED

1 Base plate
2 Feed gas conduit
3 Grid
4 Screw fitting
5 Securing ring for grid
6 Pins for grid fixing
7 Nozzle
8 Offgas opening
9 Offgas conduit with cooling
10 Offgas basket
11 Holes in offgas basket
a Mesh aperture size
b Web width FIG. 1 shows a base plate 1 of the reactor and a feed gas conduit 2. Installed in the feed gas conduit 2 is a grid 3.

Figure 2:
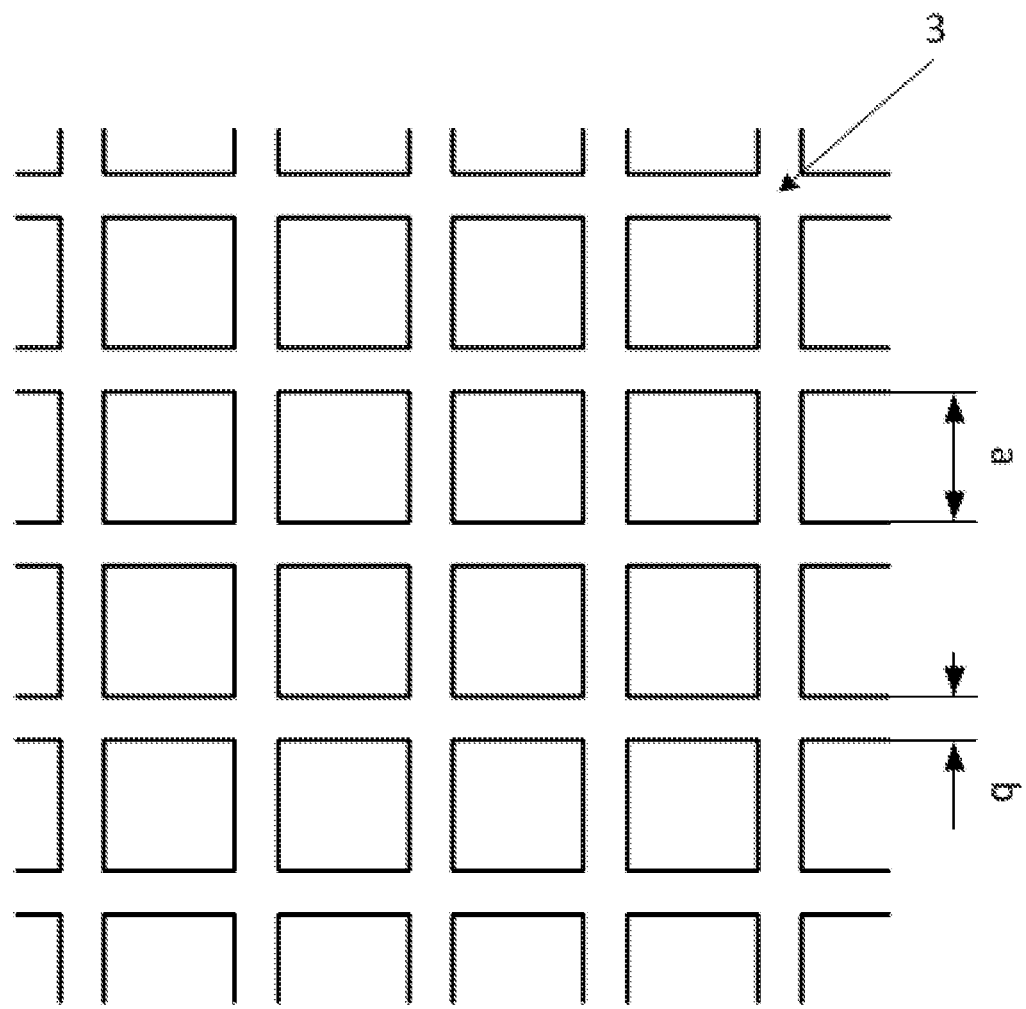
FIG. 2 shows a schematic representation of a cut-out grid.

FIG. 2 shows a grid 3 having cut-out openings. The grid 3 results from a base body with holes. The grid 3 is characterized by the mesh aperture size a and the web width b.

Figure 3:
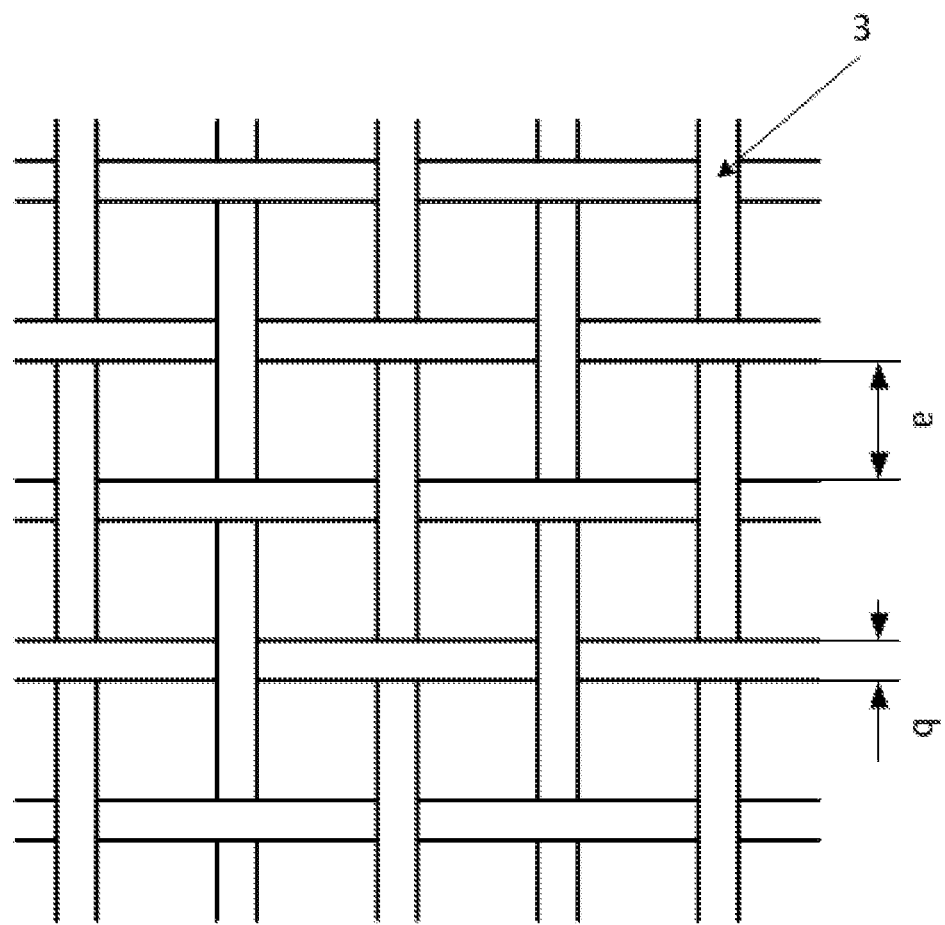
FIG. 3 shows a schematic representation of a woven grid.

FIG. 3 shows a grid 3 with woven mesh. Such a woven mesh 3 may also be characterized by mesh aperture size a and web width b.

Figure 4:
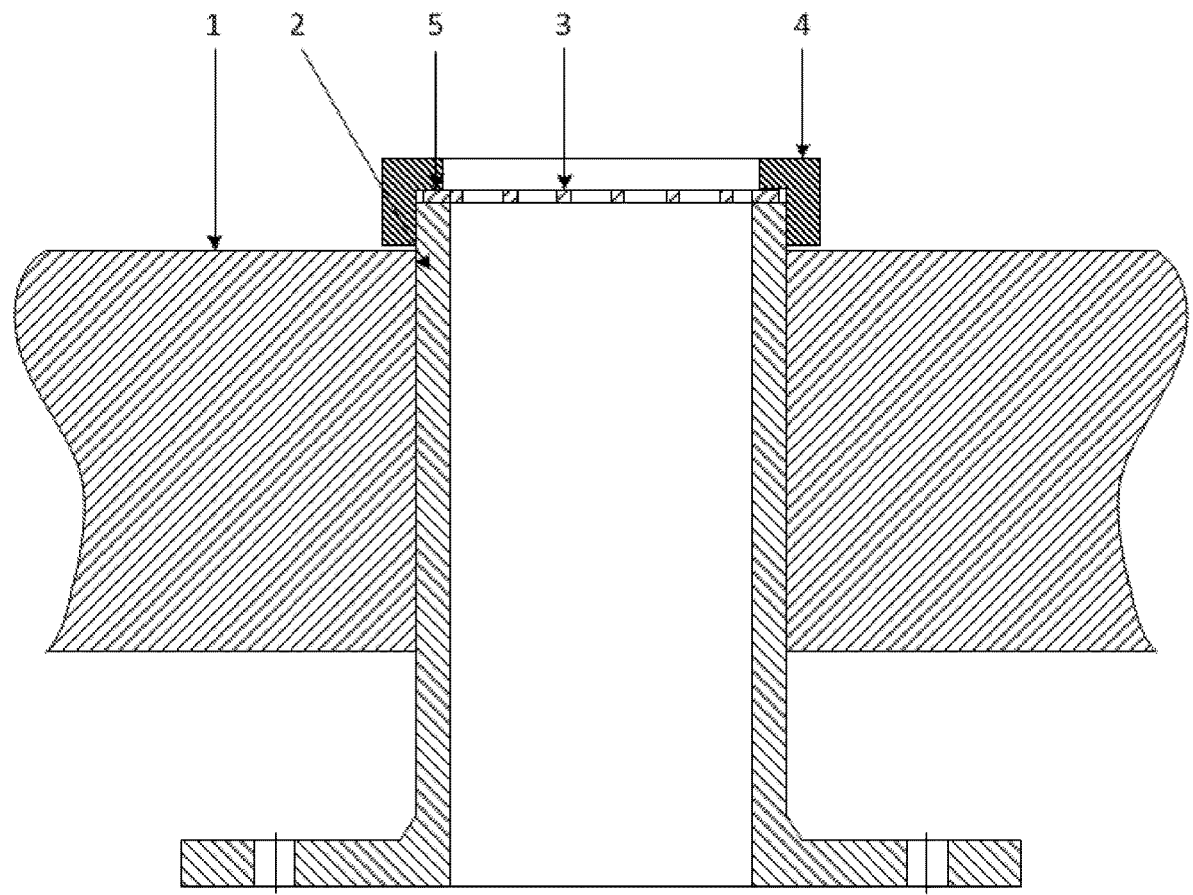
FIG. 4 shows a schematic representation with a clamped grid disc at the outlet of the feed gas conduit.

FIG. 4 shows a base plate 1 of the reactor and a feed gas conduit 2. Secured to the outlet of the feed gas conduit 2 is a grid 3. To this end there is a securing ring 5 for the grid 3 which is fixed via a screw fitting 4 to the feed gas conduit 2. This results in a grid disc clamped at the outlet of the feed gas conduit 2.

Figure 5:
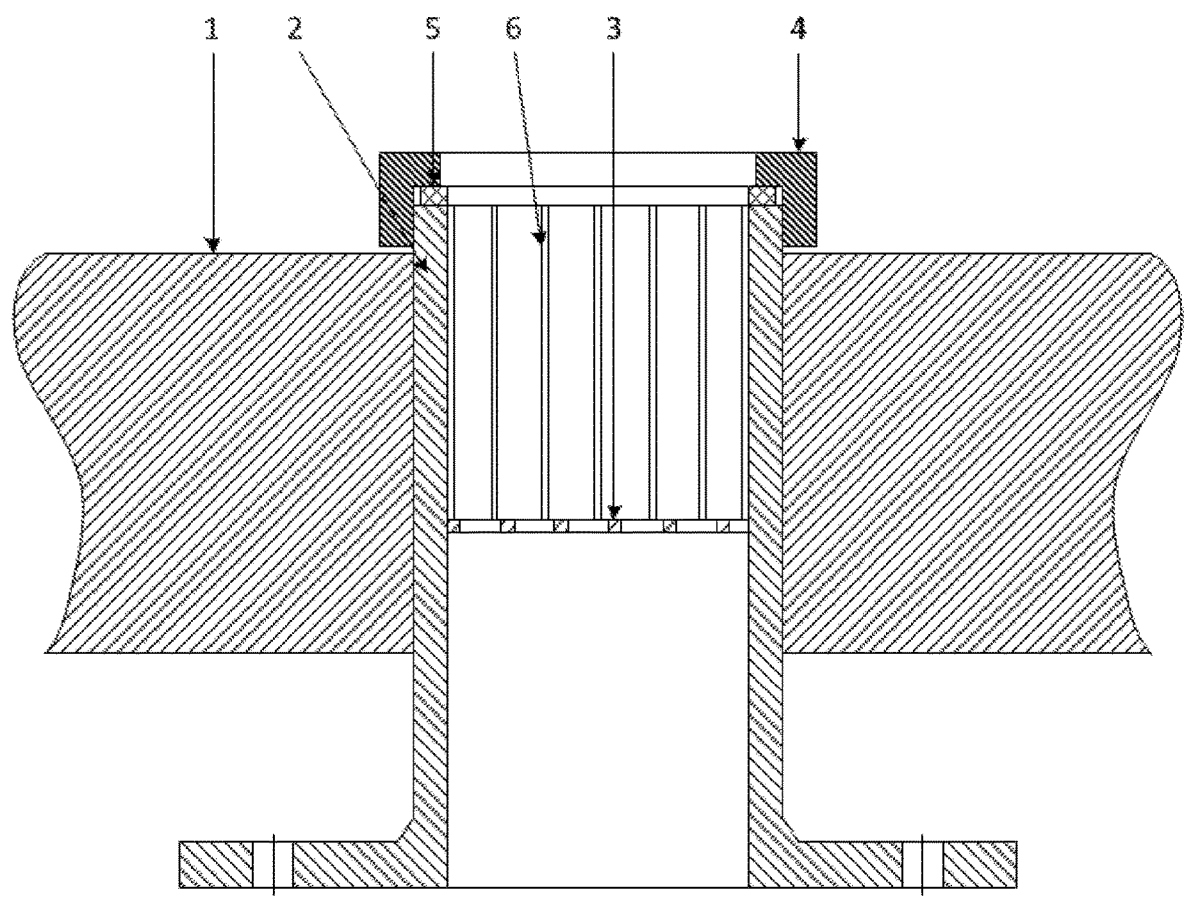
FIG. 5 shows a schematic representation of a grid secured by means of pins on a clamped ring. The grid is below the outlet of the feed gas conduit.

FIG. 5 shows a base plate 1 of the reactor and a feed gas conduit 2. At the outlet of the feed gas conduit 2 a securing ring 5 is fixed by means of a screw fitting 4 to the feed gas conduit 2. The grid 3 is located inside the feed gas conduit 2 and is secured by means of pins 6 to the securing ring. This results in a grid 3 which is located below the outlet of the feed gas conduit 2 and secured to clamped ring 5.

Figure 6:
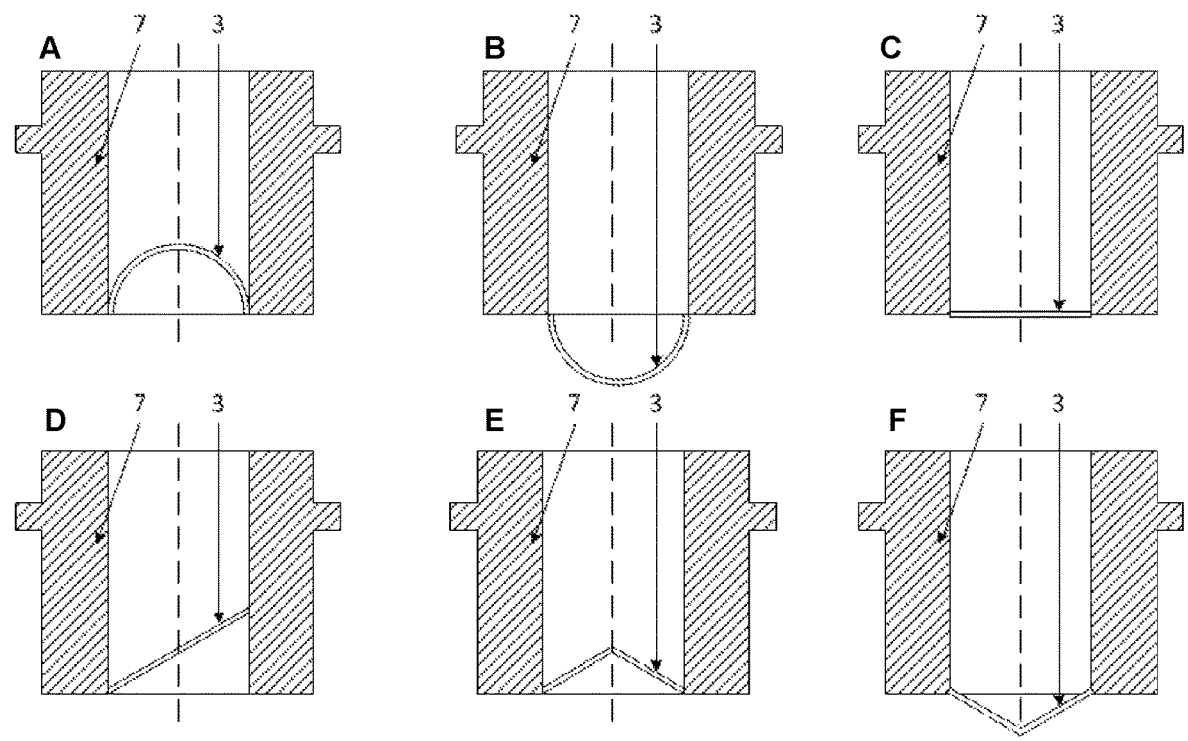
FIG. 6 shows a schematic representation of various embodiments of a grid secured to a nozzle.

FIG. 6 shows various embodiments of a grid 3 secured to a nozzle 7. The base bodies of the grids 3 have different geometries: spherical/oval (A, B), flat (C, D) and conical (E, F). Embodiment D is fixed at an angle of about 30° to the flow direction in the nozzle.

Figure 7:
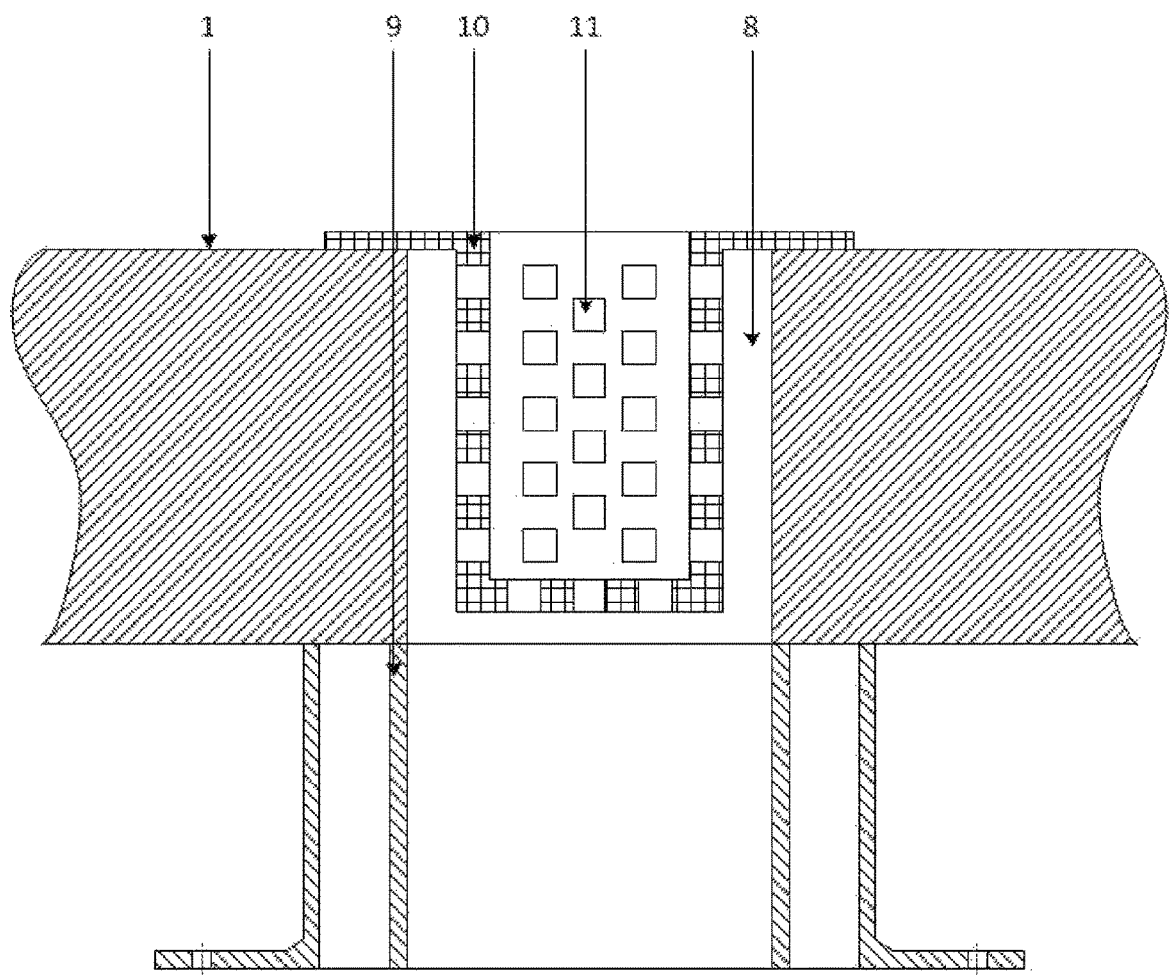
FIG. 7 shows a schematic representation of a cylindrical offgas basket.

FIG. 7 shows a base plate 1 of the reactor, an offgas opening 8 and an offgas conduit 9. Installed in the offgas conduit 9 is an offgas basket 10. The offgas basket 10 has holes 11. The offgas basket 10 is cylindrical.

Figure 8:
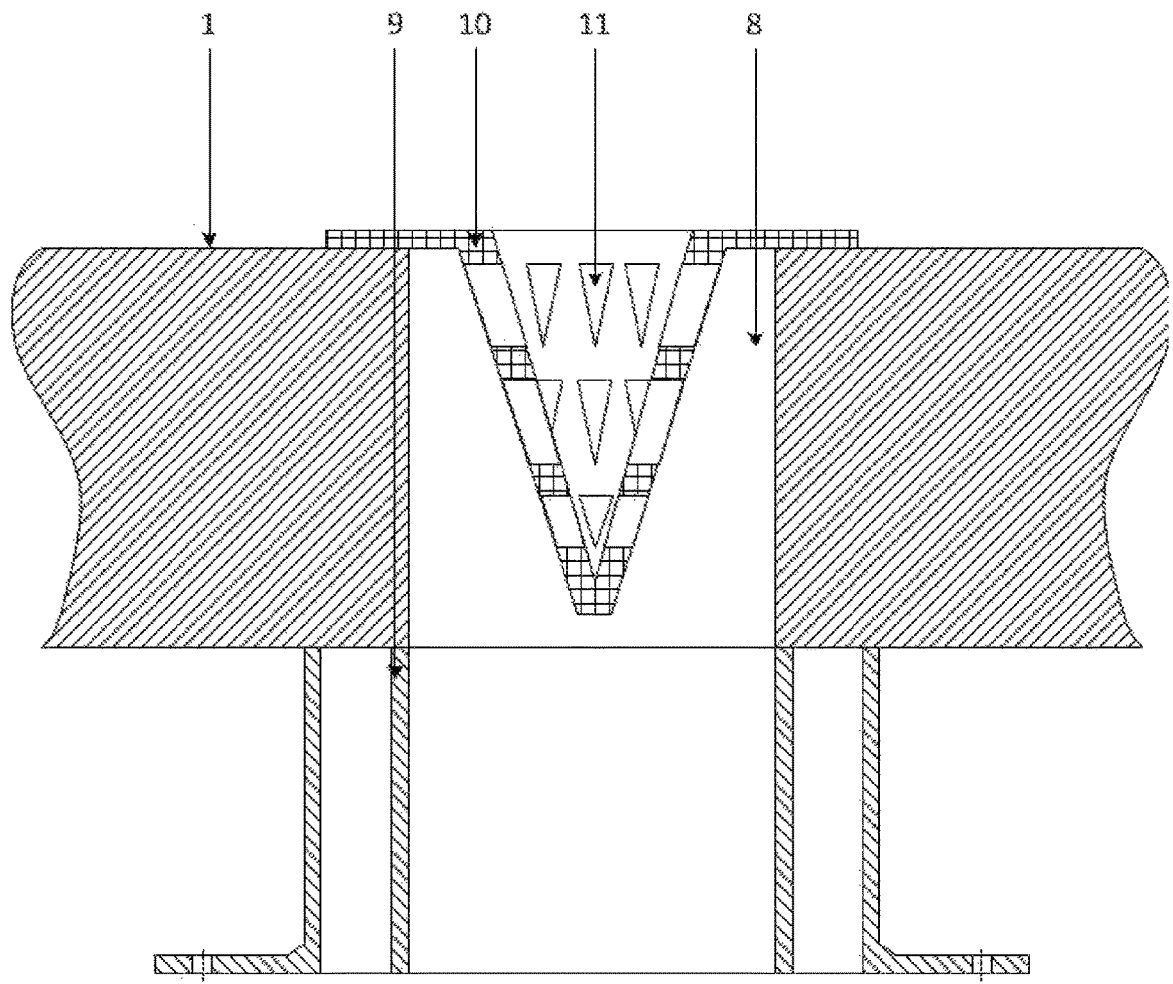
FIG. 8 shows a schematic representation of a conical offgas basket.

FIG. 8 shows a base plate 1 of the reactor, an offgas opening 8 and an offgas conduit 9. Installed in the offgas conduit 9 is an offgas basket 10. The offgas basket 10 has holes 11. The offgas basket 10 is conical.

COMPARATIVE EXAMPLE

Deposition with Nozzles Without Grid and Without Offgas Basket (Noninventive)

In about 10% of the batches silicon shards and chunks were found after endoscopy of the feed gas conduit and offgas conduit. These required laborious removal. This increased setup time by 4 hours.

Some of the silicon shards and chunks could not be found despite endoscopy. The consequence of this was that 4% of the following batches failed during the process.

This was due to rods falling over. A further consequence was that two groups of rod pair weight distribution were obtained.

In the first group, the deviation from the thickest to the thinnest rod pair based on the average rod pair weight of the batch was about 3%. This group accounted for 80% of the total and was free from silicon shards and chunks in the feed gas system.

In the second group the deviation from the thickest to the thinnest rod pair based on the average rod pair weight of the batch was about 8%. This group accounted for 20% of the total. 25% of the material from this group required downgrading on account of excessively poor morphology.

On account of the poor rod pair weight distribution an unscheduled revision (disassembly of the base plate) was performed. In the course of this silicon shards and chunks in the feed gas system were identified and removed.

EXAMPLE 1

Deposition with Nozzles with Grid and Without Offgas Basket

On account of the use of the nozzles with grids, only silicon shards and chunks smaller than the mesh aperture size of the grid can get into the feed gas system. However, these can be removed by simple backflushing. Accordingly, laborious endoscopy and removal of the silicon shards and chunks in the feed gas conduit is dispensed with.

Si chunks not found by endoscopy may still be present in the offgas system and partly block the offgas conduit. Consequently, two groups of rod pair weight distribution were in turn obtained.

In the first group the deviation from the thickest to the thinnest rod pair based on the average rod pair weight of the batch was about 3%. This group accounted for 90% of the total and was free from silicon shards and chunks in the feed gas system and offgas system.

In the second group the deviation from the thickest to the thinnest rod pair based on the average rod pair weight of the batch was about 6%. This group accounted for 10% of the total and had shards in the offgas system. 15% of the material from this group required downgrading on account of excessively poor morphology.

EXAMPLE 2

Deposition with Nozzles Without Grid and with Offgas Basket

On account of the offgas baskets in the offgas openings only silicon shards and chunks smaller than the hole diameter of the offgas baskets can get into the offgas system. However, these can be removed by simple backflushing. Accordingly, laborious endoscopy and removal of the silicon shards and chunks in the offgas conduit is dispensed with.

Si chunks not found by endoscopy may still be present in the feed gas system. Consequently, two groups of rod pair weight distribution were in turn obtained.

In the first group the deviation from the thickest to the thinnest rod pair based on the average rod pair weight of the batch was about 3%. This group accounted for 90% of the total and was free from silicon shards and chunks in the feed gas system and offgas system.

In the second group the deviation from the thickest to the thinnest rod pair based on the average rod pair weight of the batch was about 5%. This group accounted for 10% of the total and had shards in the offgas system. 10% of the material from this group required downgrading on account of excessively poor morphology.

EXAMPLE 3

Deposition with Nozzles with Grid and with Offgas Basket

On account of the nozzles with grid and the offgas baskets in the offgas openings only silicon shards and chunks smaller than the mesh aperture size of the grids can get into the feed gas system and offgas system. However, these can be removed by simple backflushing. Accordingly, laborious endoscopy and removal of the silicon shards and chunks in feed gas conduits and offgas conduits is dispensed with.

Only one homogenous group of rod pair weight distributions having a deviation from the thickest to the thinnest rod pair based on the average rod pair weight of the batch of about 3% was obtained.

Material downgrading due to poor morphology was not necessary.

The description hereinabove of illustrative embodiments is to be understood as being exemplary. The disclosure made thereby enables a person skilled in the art to understand the present invention and the advantages associated therewith and also encompasses alterations and modifications to the described structures and processes obvious to a person skilled in the art. All such alterations and modifications and also equivalents shall therefore be covered by the scope of protection of the claims.

The invention claimed is:

1. A Siemens reactor for deposition of polycrystalline silicon, having an interior delimited laterally and upwardly by a reactor wall and downwardly by a base plate, and comprising a plurality of filament rods heatable by direct passage of current and attached to the base plate, a feed gas system passing through one or more feed gas openings in the base plate for introducing a silicon-containing reaction gas mixture into the reactor, and an offgas system passing through one or more offgas openings in the base plate for discharging offgas from the reactor, wherein the feed gas system and optionally also the offgas system comprise at least one protective element made of metal, ceramic or CFC, the protective element comprising a plurality of holes and/or mesh apertures, wherein the plurality of holes and/or mesh apertures of the protective element are sized such that silicon pieces originating within the reactor which cannot be removed from the feed gas or offgas system by flushing cannot enter the feed gas system or offgas system below the protective element, but the protective element allows passage of smaller silicon pieces, wherein the feed gas system further comprises at least one nozzle, and at least one feed gas conduit connected to the nozzle at an end thereof, and the protective element is installed in the at least one nozzle or in the at least one feed gas conduit wherein the protective element has openings of a size of 2 to 15 mm as the holes and/or mesh apertures.

2. The reactor of claim 1, wherein the protective element has openings of a size of 3 to 10 mm as the holes and/or mesh apertures.

3. The reactor of claim 1, wherein each of the one or more offgas openings in the base plate for discharging offgas has a protective element.

4. The reactor of claim 3, wherein the offgas protective element(s) have a plurality of holes with areas of from 15 to 225 mm$^2$ each.

5. The reactor of claim 3, wherein the offgas protective element(s) have a plurality of holes with areas of from 15 to 150 mm$^2$ each.

6. The reactor of claim 3, wherein at least one protective element is in the form of a basket which projects into the offgas openings in the base plate and has an open end disposed toward the reactor interior.

7. The reactor of claim 6 wherein the basket has a cylindrical or conical shape.

8. The reactor of claim 6, wherein the basket has a widening at the open end which contacts the base plate.

9. The reactor of claim 6, wherein a ratio of the sum of all hole areas in the offgas basket to the total area of the offgas basket including hole areas and non-hole areas is between 0.2 and 0.9.

10. The reactor of claim 1, wherein the protective element is a grid installed at a distance of 0-500 mm from the end of the feed gas conduit which is connected to the nozzle.

11. The reactor of claim 10, wherein the grid is secured to an underside of the nozzle.

12. The reactor of claim 10, wherein a ratio of the sum of all hole areas in the grid to the total area of the grid including hole areas and non-hole areas is between 0.2 and 0.8.

13. The reactor of claim 1, wherein the offgas system comprises at least one offgas conduit and the protective element is an offgas sieve placed in the offgas conduit or in an opening in the base plate for the offgas system.

14. The reactor of claim 1, wherein all feed gas and offgas openings in the base plate have a protective element.

15. A process for producing polycrystalline silicon in a reactor of claim 1, comprising:
  supplying the plurality of filament rods with current by means of an electrode, thus heating the plurality of filament rods to a temperature at which polycrystalline silicon can be deposited on the filament rods, introducing reaction gas into the reactor through the feed gas system, depositing silicon onto the filament rods in polycrystalline form, and harvesting rods having a larger diameter than an initial diameter of the filament rods.

* * * * *